United States Patent [19]

Brindel et al.

[11] Patent Number: 5,311,531
[45] Date of Patent: May 10, 1994

[54] LIGHT GENERATOR, IN PARTICULAR FOR CONVEYING A MICROWAVE SIGNAL

[75] Inventors: Patrick Brindel, Colombes; Annaïck Trotel, Matignon, both of France

[73] Assignee: Alcatel N.V., Amsterdam, Netherlands

[21] Appl. No.: 968,822

[22] Filed: Oct. 30, 1992

[30] Foreign Application Priority Data

Oct. 31, 1991 [FR] France .................. 91 13513

[51] Int. Cl.$^5$ ............................................. H01S 3/10
[52] U.S. Cl. ........................................ 372/38; 372/26; 372/29
[58] Field of Search ................ 372/29, 31, 32, 38, 372/43, 44, 46, 26

[56] References Cited

U.S. PATENT DOCUMENTS

| | | | |
|---|---|---|---|
| 4,724,314 | 2/1988 | Caimi | 372/32 X |
| 4,789,987 | 12/1988 | Fraser | 372/31 |
| 4,791,632 | 12/1988 | Anderson et al. | 372/31 |
| 4,809,286 | 2/1989 | Kollanyi et al. | 372/38 |
| 4,995,045 | 2/1991 | Burley et al. | 372/38 |
| 5,007,062 | 4/1991 | Chesnoy | 372/26 |
| 5,179,615 | 1/1993 | Tanaka et al. | 372/44 X |

FOREIGN PATENT DOCUMENTS

| | | |
|---|---|---|
| 0120389 | 10/1984 | European Pat. Off. |
| 3508034 | 9/1986 | Fed. Rep. of Germany |
| 58-003431 | 3/1983 | Japan |
| 60-074737 | 8/1985 | Japan |
| 61-296539 | 5/1987 | Japan |

*Primary Examiner*—John D. Lee
*Attorney, Agent, or Firm*—Robbins, Berliner & Carson

[57] ABSTRACT

A laser is biased in the vicinity of the bend in its characteristic curve. It also receives, in electrical form, a base wave applied to an input of the generator and a local wave provided by a local oscillator, and it mixes these waves by adding their frequencies so as to modulate the lightwave that it emits. The invention is particularly applicable to telecommunications systems.

8 Claims, 2 Drawing Sheets

PRIOR ART

LIGHT GENERATOR, IN PARTICULAR FOR CONVEYING A MICROWAVE SIGNAL

The present invention relates to a light generator of the kind that includes a laser which is biased by a DC bias current and which is controlled by an AC control current to emit a modulated lightwave. It applies, particularly but not exclusively, to conveying microwave signals, which term is used herein to designate a wave at microwave frequency and modulated by a useful signal.

BACKGROUND OF THE INVENTION

At present, it is difficult to convey microwave signals over great distances because of the attenuation in coaxial cables and in metal waveguides. At 3 GHz, such attenuation is of the order of 0.5 dB/m for a 17/18-RG 217 type cable. Remote antenna location and microwave signal distribution constitute examples of situations where microwave signals need to be conveyed. Optical connections offer an advantageous alternative since the attenuation of an optical fiber is about 0.2 dB/km, such that over large distances, losses between the transmitter and the receiver due to conversion from electricity to light and from light to electricity are compensated by the very low attenuation.

Unfortunately, although an optical fiber has a large bandwidth, the same does not apply to its terminal components. In particular, known lasers have limited passband. The passband is limited mainly by laser packages because of the cutoff frequencies presented by such packages. The semiconductor chips that constitute such lasers are intrinsically capable of operating at much higher frequencies. It is possible to improve the packages, but expensive.

Particular objects of the present invention are the following:
  overcoming said passband limitation of packages;
  making a signal-conveying system in a manner that is cheap, and in particular a system for conveying microwave signals;
  making a signal frequency conversion system that is cheap, in particular a system for microwave signals, and in particular if said signal is to be conveyed by an optical waveguide; and
  generating cheaply a lightwave that is modulated at a changed frequency, in particular a frequency that is higher than the frequency of a signal that is to be carried by said wave, said signal being a microwave signal, in particular.

SUMMARY OF THE INVENTION

According to the present invention, such objects can be achieved by using a laser that is biased close to the bend in its characteristic curve, and that is controlled by a plurality of control currents.

Choosing the bias current in this way enables the laser to mix said control currents by combining their frequencies to modulate the lightwave emitted by the laser.

BRIEF DESCRIPTION OF THE DRAWINGS

An embodiment of the invention is described by way of example with reference to the accompanying drawings, in which.

DETAILED DESCRIPTION

Figure 1:
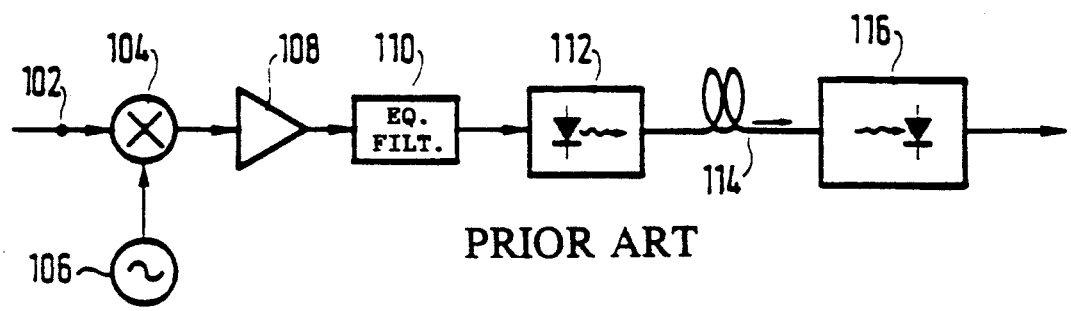
FIGS. 1 and 2 are block diagrams showing two prior art systems for conveying microwave signals.

The prior art system of FIG. 1 comprises an input 102 for receiving a base wave constituted by a microwave at a base frequency and modulated by a useful signal. This wave is applied to a microwave mixer 104. The mixer also receives a local wave provided at a local frequency by a local oscillator 106. It provides, in particular, a transposed wave whose frequency is a transposed frequency equal to the sum of the base frequency plus the local frequency, said operation constituting frequency transposition.

The transposed wave passes through an amplifier 108 and an equalizing filter 110 prior to being applied to a laser 112 constituted by a semiconductor chop disposed in a package (not shown). The power losses in the mixer 104 and in the equalizing filter make the presence of the amplifier 108 necessary to ensure that said wave is capable of constituting the control current for said laser. The laser emits a modulated lightwave which is guided by an optical fiber 114 which constitutes a transport fiber and which transmits said wave to a photodetector 116 situated remotely from the laser 112. The photodetector restores the transposed wave in the form of an electrical microwave.

When, for example, the base frequency, the local frequency, and the transposed frequency are to be equal to 0.89 GHz, to 1 GHz, and to 1.89 GHz, respectively, it is very expensive to make the package for the laser 112.

Figure 2:
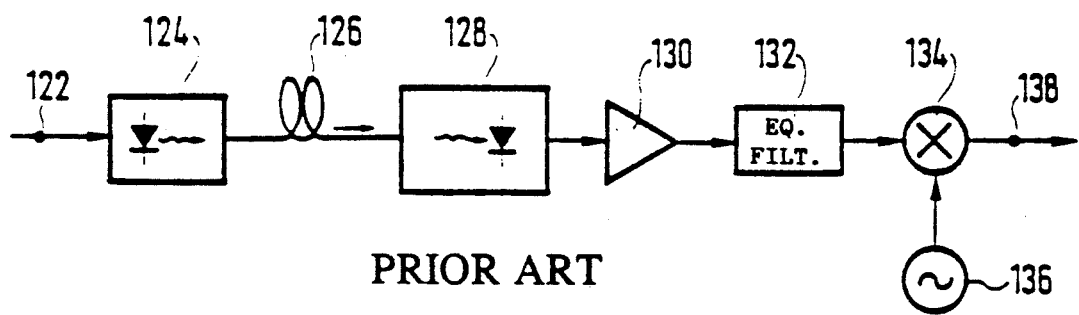

The elements of the known system in FIG. 2 are equivalent to those shown in FIG. 1. However the positions of said elements have been changed. The input 122 of the system shown in FIG. 2 receives a base wave, in particular a microwave. This wave is applied to a laser 124 constituted by a semiconductor chip disposed in a package (not shown). The laser emits a modulated lightwave which is guided by an optical fiber 126 that constitutes a transport fiber and that transmits said wave to a photodetector 128 situated remotely from the laser 122. The photodetector 128 restores the base wave in the form of an electrical microwave. This wave is then applied to a microwave mixer 134 after having its level restored by a microwave amplifier 130 and after being shaped by an equalizing filter 132. The mixer also receives a local wave provided at a local frequency by a local oscillator 136. The mixer 134 delivers at its output 138 a transposed electrical wave whose frequency is equal to the sum of the base frequency plus the local frequency.

For a remote antenna, this system requires the mixer and the local oscillator to be disposed close to the antenna, generally outside, thereby increasing climatic stresses, which in turn have an influence on reliability and thus on the cost of components.

Figure 3:
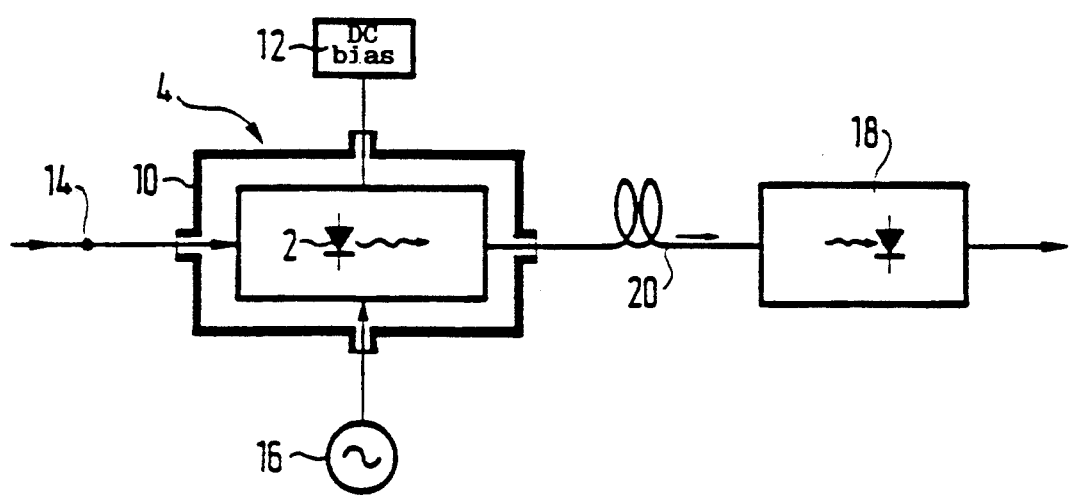
FIG. 3 is a diagram of the system of the present invention for conveying a microwave signal.

With reference to FIG. 3, the following description begins with the various elements that a signal-conveying system constituted by a generator that implements the present invention has in common with the known system of FIG. 1, at least with respect to the functions described with reference to FIG. 1.

These common elements are the following:
  A semiconductor chip 2 for constituting a laser 4. The laser is biased by a DC bias current and it is controlled by an AC control current to emit an amplitude modulated lightwave. A characteristic curve 6 of said laser defines the amplitude of said wave as a function of the sum of the currents that are applied thereto. Said curve has a bend 8.

A package 10 for containing said chip 2. The package includes electrical connection elements enabling said bias and control currents to be applied to said chip. It has a cutoff frequency beyond which it no longer enables such a control current to be applied.

An electrical bias source 12 and a control source for providing said bias and control currents.

In the known systems of FIGS. 1 and 2, frequency transposition is performed by the mixer 104 or 134 and requires the signal to be shaped. It is performed by the elements 102 to 110 in FIG. 1 or 130 to 138 in FIG. 2.

The above-specified common elements further include:

A transport optical fiber 20 which receives the modulated lightwave output by the laser 4 and which guides said lightwave remotely to an optoelectronic detector 18.

The optoelectronic detector 18 which receives the lightwave output from the fiber and which itself outputs the wave in electrical form. The optical connection assembly serves to convey a useful signal which modulates the base wave on input and which modulates the transposed wave on output.

According to the present invention, the system of FIG. 3 includes two electrical control sources 14 and 16 for simultaneously providing two individual control currents at two individual frequencies each of which is lower than the cutoff frequency of the package 10 for the laser 4. The package includes connection elements for applying these two individual control currents to the semiconductor chip 2 of the laser 4. The bias source 12 provides a bias current that biases said laser to the vicinity of the bend 8 in its characteristic curve 6. Modulation thus takes place in a highly non-linear zone of the characteristic curve of the laser. As a result the laser mixes said two individual control currents so as to modulate said lightwave by a transposed wave having a transposed frequency equal to the sum of the two individual frequencies, or possibly equal to some other linear combination of said two frequencies.

A first electrical control source is constituted by an input 14 of the generator for receiving a base wave modulated by a useful signal and for providing the laser 4 with a first individual control current constituted by said base wave. The second electrical control source is constituted by a local oscillator 16 providing a local wave constituting a second individual control current and presenting a local frequency.

The generator constituted in this way transports a useful signal that modulates its input base wave and its output transposed wave.

The present invention is advantageously applicable when the sum of the individual frequencies is greater than the cutoff frequency of the package 10 of the laser 4. The cutoff frequency often lies in the range 0.8 GHz to 1.8 GHz, and is typically close to 1.2 GHz.

For example, the base frequency, the local frequency, and the transposed frequency may be equal respectively to 0.89 GHz, to 1 GHz, and to 1.89 GHz. The cutoff frequency of the package 10 may then be a little greater than 1 GHz, which makes it possible to use a package that is of conventional type and not very expensive. The semiconductor chip 2 may also be of conventional type and not very expensive. This stems from the fact that, typically, for a low cost laser, the cutoff frequency of the semiconductor chip may be five times that of its package.

The present invention also makes it possible to omit the microwave mixer, thereby further reducing the cost of the connection.

Figure 4:
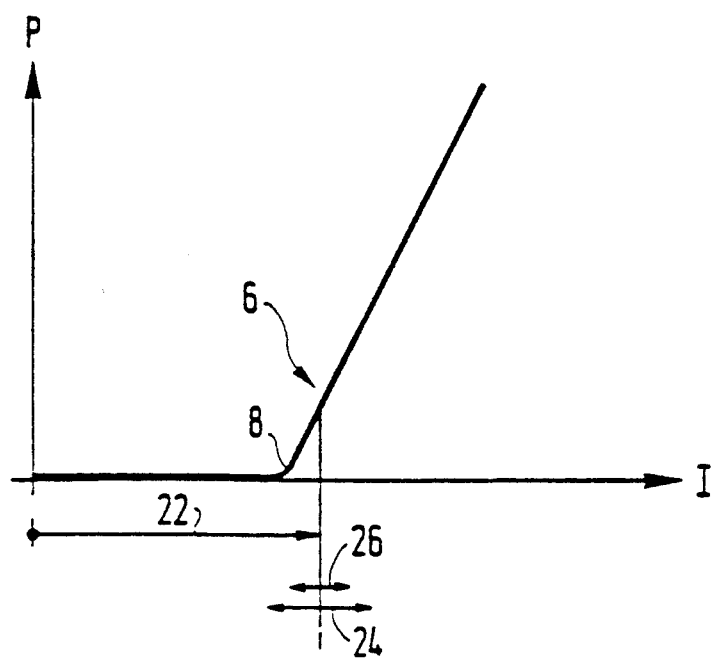
FIG. 4 is a simplified graph showing the characteristic curve of a laser in the system of FIG. 3.

In FIG. 4, total current I representing the sum of the two control currents is plotted along the abscissa, while the light power P of the modulated wave emitted by the laser 4 is plotted up the ordinate. Arrows 22, 24, and 26 represent the bias current and the amplitude of variations in the base wave and in the local wave respectively superposed thereon.

By way of example, the laser 4 may be a type DL 2500/1300 laser manufactured by the French firm CIT Alcatel and having a characteristic curve with a bend at 31 mA. A bias current of 34 mA may be applied thereto. The base wave and the local wave may then have respective powers of $-16$ dBm and of $-14$ dBm, thereby enabling a lightwave to be emitted that is modulated at the transposed frequency with a power of $-50$ dBm as measured at the photodiode prior to amplification, if any.

In some cases, the transposed frequency Ft may be equal to the sum of the base frequency Fb and a harmonic of the local frequency Lo. For example, it is possible for Ft=Fb+2Lo.

We claim:

1. A light generator for conveying a microwave signal, the generator comprising a laser inside a package having a predetermined cut-off frequency, the laser being biased by a DC bias current close to a bend in a characteristic curve of the laser, the laser being controlled from outside the package by a plurality of AC control currents having respective individual frequencies which are lower than the predetermined cut-off frequency of the package, a linear combination of said individual frequencies establishing a transposed frequency higher than the cut-off frequency, the AC control currents being combined by the laser so as to modulate a lightwave emitted by the laser at the transposed frequency.

2. A light generator for conveying a microwave signal, said generator comprising:

a semiconductor chip embodying a laser for emitting an amplitude modulated lightwave in response to bias and control currents, a characteristic curve of said laser defining the amplitude of said wave as a function of the sum of the currents applied thereto, said curve having a bend;

a package for containing said chip, said package including electrical connection elements enabling said bias and control currents to be applied to said chip, said electrical connection elements having a package cutoff frequency beyond which the connection elements do not allow such a current to be applied;

two AC control sources for simultaneously providing two individual electrical control currents at two individual frequencies, both of which are lower than said package cutoff frequency and each of which is applied to said chip via a respective electrical connection element of said package; and a DC bias source providing an electrical bias current that biases said laser to the vicinity of a bend in its characteristic curve, thereby giving the laser a non-linear characteristic whereby it mixes said two individual electrical control currents to modulate said lightwave with a transposed wave having a transposed frequency equal to a linear combination of the two individual frequencies.

3. A generator according to claim 2, wherein said transposed frequency is equal to the sum of said two individual frequencies and lies between said package cutoff frequency and twice said package cutoff frequency.

4. A generator according to claim 3 wherein said package cutoff frequency of the package is greater than 0.8 Ghz.

5. A generator according to claim 2, wherein a first one of said control sources is an input of said generator receiving a modulated base wave that is modulated by a useful signal thereby applying to said laser a first one of said individual control currents in the form of said modulated base wave; and a second one of said control sources is a local oscillator having a local frequency thereby applying to said laser a second one of said individual control currents in the form of a local wave having said local frequency.

6. A generator according to claim 5, said generator further comprising an optoelectronic detector for receiving said modulated lightwave output from the laser and for responding by providing said transposed wave in electrical form, whereby said generator performs frequency conversion.

7. A generator according to claim 6, wherein said optoelectronic detector is situated remotely from the laser, and said generator further comprises a transport optical fiber for receiving said modulated lightwave output from said laser and for guiding said wave to said optoelectronic detector, whereby said generator functions as an optical link for transporting said useful signal.

8. A generator according to claim 5, wherein said base wave and said local wave are both microwaves.

* * * * *